June 17, 1969 S. E. BEALE 3,451,034

PRINTED CIRCUIT BOARD EJECTION AND LOCKING MECHANISM

Filed Dec. 19, 1966 Sheet 1 of 2

INVENTOR.
STANLEY E. BEALE

BY Christie, Parker & Hale
ATTORNEYS

INVENTOR.
STANLEY E. BEALE
BY
Christie, Parker & Hale
ATTORNEYS

United States Patent Office 3,451,034
Patented June 17, 1969

3,451,034

PRINTED CIRCUIT BOARD EJECTION AND LOCKING MECHANISM

Stanley E. Beale, Duarte, Calif., assignor to Scanbe Manufacturing Corporation, Monterey Park, Calif., a corporation of California Filed Dec. 19, 1966, Ser. No. 602,658
Int. Cl. H05k *1/00;* H01r *13/62, 13/54*
U.S. Cl. 339—17 6 Claims

ABSTRACT OF THE DISCLOSURE

An ejector for use with a printed circuit board mounted with printed circuit board guides into an electrical connector. The ejector and the mounting apparatus for the printed circuit board are defined to lock the board to the mounting apparatus when positioned in the electrical connector. The ejector is mounted to an edge of the circuit board to allow it to be cammed by means of the mounting apparatus to eject the board from the electrical connector.

The present invention relates to a device to be used in conjunction with a printed circuit board and more particularly for a device to secure such circuit boards to a supporting structure and to enable removal of the printed circuit board therefrom with greater ease.

Printed circuit boards are generally arranged in a side by side relationship for insertion in individual receptacles that include an electrical connector. These receptacles are provided with guides to receive the printed circuit board and guide them to be inserted in or removed from the electrical connectors. One such arrangement is disclosed in U.S. Patent 3,017,232, granted Jan. 16, 1962, to H. Schwab et al. The printed circuit boards are pivoted with electrical terminals which are inserted in the electrical connector to provide the electrical coupling. The electrical connector has flexible contacts that are biased against the terminals to exert a relatively high degree of pressure upon them. To aid in the removal of the circuit boards from the connectors, it is known in the art to utilize ejecting means to disengage the terminals from the connector. One arrangement of this type is disclosed in application bearing Ser. No. 369,687 and now Patent No. 3,311,863 granted on Mar. 28, 1967, and entitled "Printed Circuit Board Hardware," and assigned to the same assignee as the present application. The structure disclosed in the aforementioned application utilizes means to eject the circuit board and independent means to lock the board to the supporting structure. The two means are independent from each other. That method does not insure a positive lock where the board is inserted in the electrical connector.

The present invention provides an improved, simple and relatively inexpensive locking ejector. The locking ejector of the present invention is arranged such that upon insertion of the circuit board in the electrical connector, the circuit board is automatically locked to the supporting structure upon closing the ejector and, because of their interengagement, remains locked until the ejector is operated to remove the circuit board. To operate the ejector, and thereby unlock the circuit board, the frictional holding force between the circuit board and the connector, which is substantial, must be overcome, thereby eliminating the possibility of inadvertently unlocking the circuit board. It has the further advantage that the ejector may be operated by simply positioning it into an open or closed position with a finger. A further advantage of my invention is that it permits space-saving arrangement of circuit boards mounted in a side by side relationship. This I achieve by having all operative elements of my invention coact with the receptacle for the circuit board, thereby eliminating the need for additional parts which have to be mounted adjacent the receptacle that would increase the space requirement.

These and other features of my invention will become readily apparent after consideration of the specification and the drawings, in which.

Figure 1:
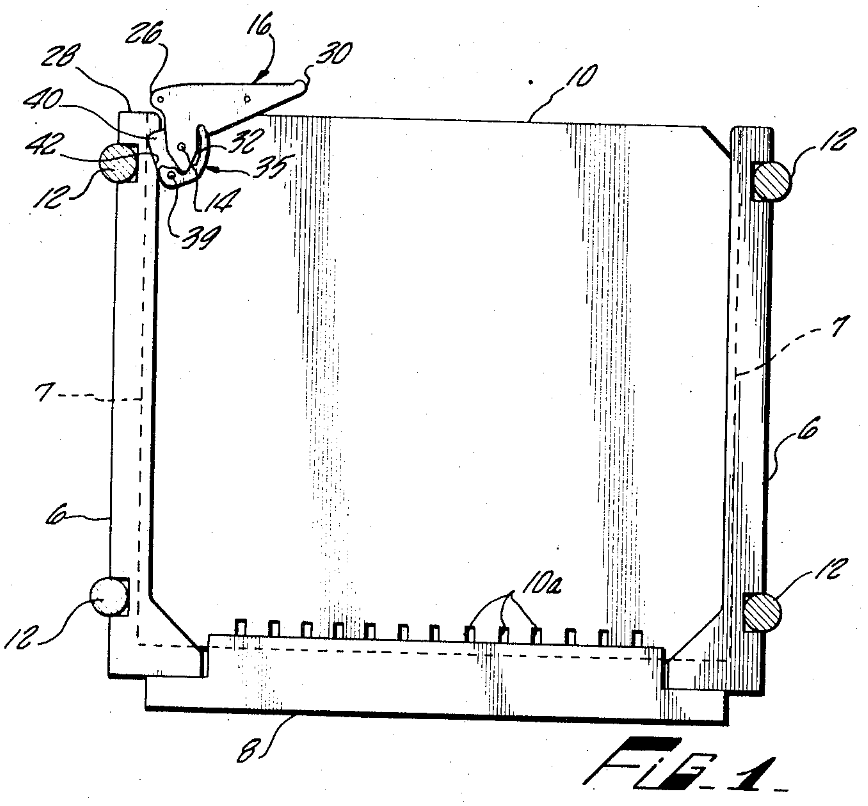
FIG. 1 is a side elevational view, with portions in section, of a circuit board with the ejection and locking means embodying the invention mounted thereon and illustrating the circuit board in engagement with an electrical connector.

The present invention will best be understood by first considering the environment in which it is used and as it is illustrated in FIG. 1. Basically, it includes a pair of mounting elements 6, an electrical connector 8, which is preferably mounted between the mounting elements 6, and a printed circuit board 10. These elements may be mounted in a side by side relationship on holding elements, shown as the rods 12 in the fashion described in the aforementioned Schwab et al. patent. A locking ejector 16 constructed according to the present invention is pivotally mounted on the circuit board 10 and is provided for removal of the circuit board 10 from the frictional engagement with the electrical connector 8 and to lock the board 10 in position.

The conventional electrical components usually mounted on the circuit board 10 are not illustrated except for the electrical terminals 10A disposed adjacent the lower edge of the circuit board 10. The conventional electrical connector 8 is commercially available and receives the lower edge of the circuit board 10, whereby the printed circuit portions (not shown) are aligned with respective electric circuit terminals within the connector 8.

The mounting elements 6 are disposed on opposite sides of the circuit board 10 and include a longitudinal track 7 extending along its length for the purposes of guiding the vertical movement of the circuit board into and out of engagement with the electrical connector 8. At least one of the mounting elements 6 is provided with a recess 42 on the face adjacent the longitudinal slot.

Figure 3:
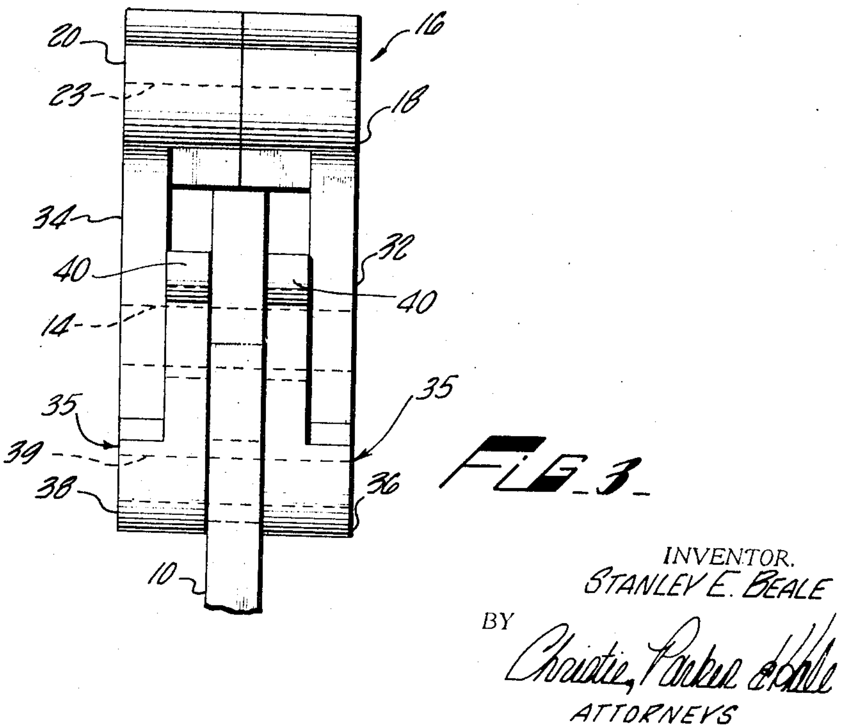
FIG. 3 is a partial, front elevational view of the ejection mechanism as illustrated in FIG. 1.

The ejector 16, which is pivotally mounted on a shaft 14, is preferably constructed of a plastic, such as nylon, and may be fabricated by an injection molding process. As best seen in FIG. 3, it may consist of two similar halves 18 and 20 which are pinned together by means of the pins 22 and 23. The ejector 16 has an upper portion consisting of a lever 30 which is shaped such that an operator may insert his finger between the lever 30 and the circuit board 10 for purposes of operating the ejector. Opposite the lever 30 the ejector 16 is provided with a protrusion 26 which has a generally semi-circular shape and which coacts with a flat surface 28 on the mounting element 6. It can now be seen that if the ejector is operated by turning it counterclockwise, as viewed in FIG. 2, the protrusion 26 will engage the flat surface 28 and, by continuation of the rotating movement around shaft 14, which connects the ejector 16 to the circuit board 10, the circuit board 10 will be slidably forced in an upward direction, thereby disengaging the electrical terminals 10A of the circuit board from the electrical connector 8. The circuit board 10 may now be removed from the mounting elements 6 by manually sliding it along the longitudinal tracks 7 until the circuit board 10 is free of the mounting elements.

Figure 2:
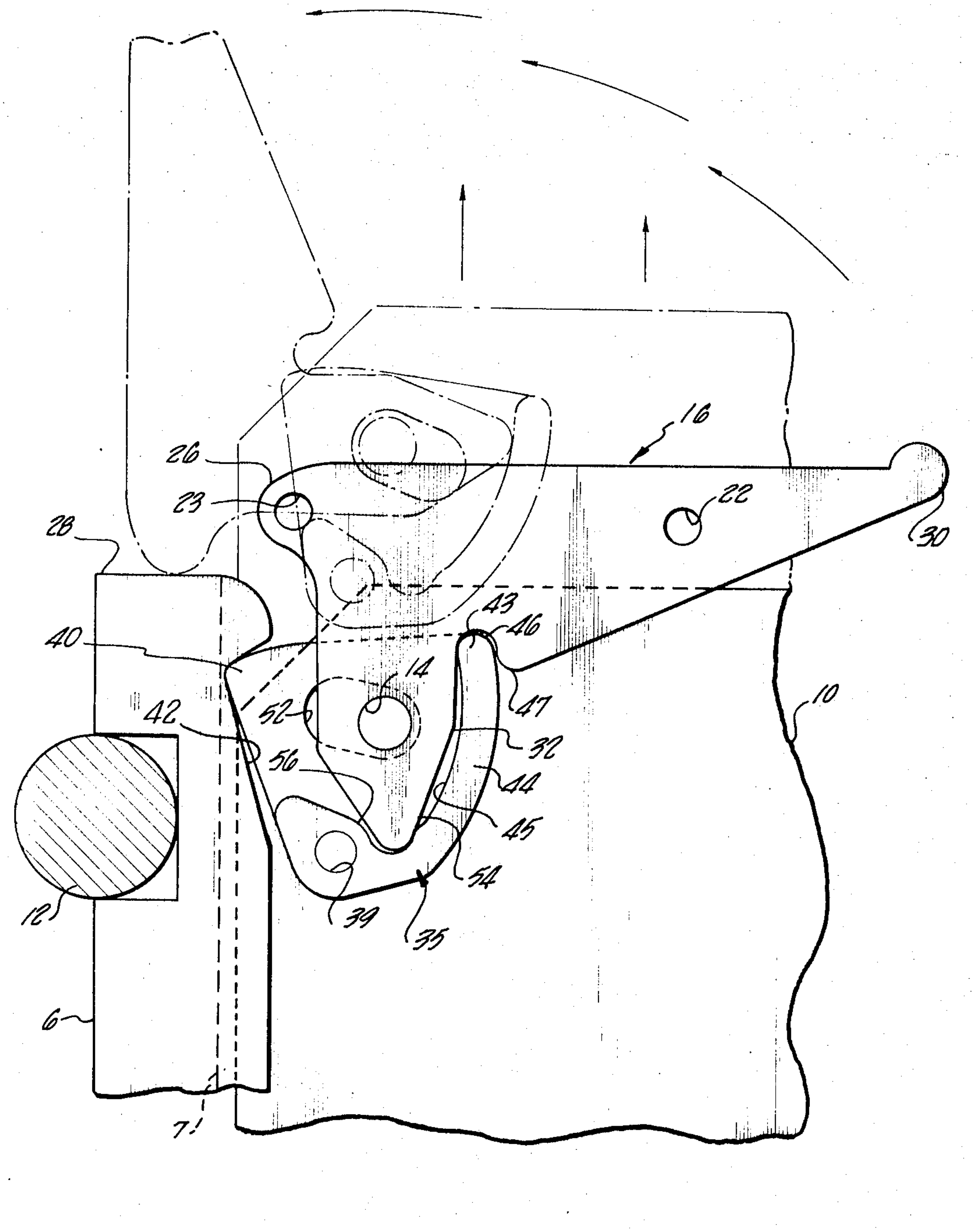
FIG. 2 is a partial, enlarged view of the locking and ejection mechanism of FIG. 1 and illustrating the ejection position in dotted outline.

As may be best seen from examining FIGS. 2 and 3, a pawl 35 consisting of two opposite hand parts, left and right hand parts, 36 and 38, which are mounted on either side of the circuit board 10, is pivotally attached to the circuit board by means of a pin 39. This pawl is preferably constructed of a plastic such as nylon and may be fabricated by means of an injection molding process. The two halves 36 and 38 of the pawl are arranged in an overlapping relationship with a pair of bifurcated leaves 32 and 34 comprising part of the ejector 16. Each of the parts 36 and 38 of the pawl 35 have a generally rectangular shape, and the side adjacent the mounting element 6 is provided with a protrusion—an outwardly extending portion 40 with a configuration similar to that of the recess 42 in the mounting element 6. The main body of the pawl 35 consists of a flat portion which is provided with an elongated opening 52 to accommodate the shaft 14 around which the ejector 16 pivots. The depending portions 32 and 34 of ejector 16 extend on either side of the circuit board 16 beyond the pivoting shaft 14 with the lower end 54 having a generally pointed shape. At the side opposite to the side containing the protrusion 40, the pawl 35 is provided with a raised portion 44 defining a generally circular ejection track 45 that engages the pointed ends 54 of the ejector depending portions 32 and 34 and extending upward into a recess 46 in depending portions 32 and 34.

It can now be seen that when the circuit board is slidably inserted into the longitudinal tracks 7 of the mounting element 6 until the circuit board terminals 10A are in engagement with the electrical connector 8, the protrusion 40 of the pawl 35 is at a position opposite the recess 42 in the mounting element 6. At this point, the ejector 16 is at a position intermediate between the closed and the open position shown in FIG. 2. Rotating the lever 30 of the ejector 16 in a clockwise direction, as viewed in FIG. 2, will cause the ends 54 of the depending portions 32 and 34 to engage the convex portion 56 of the raised portion 44 of the pawl 35 and rotate the pawl until the upper end 43 of the raised portion comes in contact with the nose 47 defining the recess 46 in the depending portion 32. By continuing the rotation until the ejector has come into the closed position as shown in FIG. 2, the nose 47 engages the upper end 43 of the raised portion 44 and the pawl will be further pivoted in a counterclockwise direction, thereby engaging the protrusion 40 of the pawl with the recess 42 in the mounting element 6. The circuit board 10 is now in a locked position with the mounting elements 6 such that any movement of the circuit board along the longitudinal track 7 is made impossible; the circuit board is locked. Since the upper end 43 of the raised portion 44 is now firmly engaged with the recess 46, the pawl cannot be moved into an unlocked position. At the same time, the raised portion 44 and the recess 46 are defined with respect to each other such that rotation of the ejector 16 in the counterclockwise direction, as viewed in FIG. 2, will cause a frictional engagement between the upper end 43 of the raised portion 44 and the nose 47 defining the recess 46. This engagement may only be overcome by applying a substantial force to the lever 30 of the ejector 16. Thus, the pawl 35 and the ejector 16 are firmly engaged, preventing any unintentional operation of the ejector or unintentional loss of the lock between the pawl 35 and the mounting element 6.

If it is desired to remove the circuit board from the mounting element 6, the lever 30 of the ejector 16 is simply rotated as described above. The rotational movement of the ejector will cause the pointed ends 54 of the depending portions 32 and 34 to engage the circular ejection track 45 of the pawl 35, thereby causing the pawl to be pivoted in a clockwise direction, as seen in FIG. 2. This pivoting of the pawl disengages the protrusion 40 and the recess 42, thereby unlocking the circuit board 10 from the mounting element 6. It should be evident now that the present invention has advanced the art through provisions which permit a circuit board to be locked to its supporting frame, whereby that lock is positively maintained until and automatically released when ejector 16 is operated.

What is claimed is:

1. A circuit board mounting and ejecting device for use with a mounted circuit board including a pair of circuit board mounting and guiding elements each having a longitudinal track defined on one side thereof and mounted to slidably receive and secure a circuit board therein, at least one of said mounting elements being provided with a recess in the upper portion of said mounting element adjacent said longitudinal track, an electrical connector mounted between said mounting elements to slidably receive and secure a circuit board from said mounting elements, a circuit board arranged in electrical engagement with the electrical connector and slidably held between said mounting elements, a circuit board ejector pivotally mounted adjacent a corner of the circuit board, the upper portion of said ejector comprising a lever and a protrusion for coacting with the mounting element to slidably eject the circuit board when the ejector is pivoted against the adjacent mounting element, said ejector including a pair of spaced leaves arranged on opposite sides of the circuit board and pivoted thereto, and a pawl pivotally mounted adjacent a corner of the circuit board in an overlapping relationship with the ejector and comprising similar parts disposed on opposite sides of the circuit board, each part of said pawl including a protrusion having a configuration relative said recess in the mounting element such that pivoting of the pawl will cause said protrusion to become nested in said recess, said pawl and said ejector being defined and constructed relative each other whereby said leaves are provided with a recess and said pawl is provided with a raised portion, said recess having a configuration relative said raised portion to enable it to engage said raised portion when the ejector is in a locked position and to release the raised portion when the ejector is operated to eject the circuit board.

2. A circuit board mounting and ejecting device for use with a mounted circuit board including a pair of circuit board mounting and guiding elements each having a longitudinal track defined on one side thereof and mounted to slidably receive and secure a circuit board therein, at least one of said mounting elements being provided with a recess in the upper portion of said mounting element immediately adjacent said longitudinal track, an electrical connector mounted between said mounting elements to slidably receive and secure a circuit board received from said mounting elements, a circuit board arranged in electrical engagement with the electrical connector and slidably held between said mounting elements, a circuit board ejector pivotally mounted adjacent a corner of the circuit board, the upper portion of said ejector comprising a lever and a protrusion for coacting with the mounting element to slidably eject the circuit board when the ejector is pivoted against the adjacent mounting element, said ejector including a pair of spaced leaves arranged on opposite sides of the circuit board and pivoted thereto, and a pawl pivotally mounted adjacent a corner of the circuit board in an overlapping relationship with the ejector and comprising similar parts disposed on opposite sides of the circuit board, each part of said pawl containing a protrusion having a configuration relative said recess in the mounting element such that pivoting of the pawl will cause said protrusion to become nested in said recess, said pawl being defined and constructed relative the ejector to permit the ejector to engage and hold the pawl when the ejector is in a locked position and to release the pawl when the ejector is operated to eject the circuit board, said pawl including a raised portion and said leaves having a configuration defined relative said raised portion such that upon operation of the ejector said leaves engage said recess and pivot the pawl causing said protruding portion of the pawl to become disengaged from the mounting element.

3. A circuit board mounting and ejecting device for use with a mounted circuit board including a pair of circuit board mounting and guiding elements each having a longitudinal track defined on one side thereof and mounted to slidably receive and secure a circuit board therein, at least one of said mounting elements being provided with a recess in the upper portion of said mounting element immediately adjacent said longitudinal track, an electrical connector mounted between said mounting elements to slidably receive and secure a circuit board from said mounting elements, a circuit board arranged in electrical engagement with the electrical connector and slidably held between said mounting eleemnts, a circuit board ejector pivotally mounted adjacent a corner of the circuit board, the upper portion of said ejector comprising a lever and a protrusion for coacting with the mounting element to slidably eject the circuit board when the ejector is pivoted against the adjacent mounting element, said ejector including a pair of spaced leaves arranged in opposite sides of the circuit board and pivoted thereto, and a pawl pivotally mounted adjacent a corner of the circuit board, said pawl containing a protrusion defined and constructed relative said recess in the mounting element for coaction with the mounting element to cause said circuit board to be locked thereto, said pawl being characterized by a flat portion which is in an overlapping relationship with a leaf of the ejector, said flat portion being further provided with a raised portion having a configuration defined and constructed relative the leaf of the ejector to engage a portion of said leaf such that upon operation of the ejector the interengagement of the leaf and said raised portion will cause the pawl to be pivoted into an unlocked position.

4. A circuit board mounting and ejecting device as claimed in claim 3 wherein said said leaves are provided with a pivot and wherein said flat portion of the pawl is provided with an opening defined relative said pivot and having a configuration to accommodate said pivot while the pawl is being pivoted.

5. A circuit board ejecting device comprising an ejector adapted to be pivotally mounted adjacent a corner of a circuit board for ejecting the circuit board when pivoted against a circuit board support structure and when mounted therewith, said ejector including a pair of spaced leaves to be arranged on opposite sides of the circuit board, and a pawl comprising similar parts adapted to be disposed on opposite sides of a circuit board and to be pivotally mounted to the circuit board adjacent to and in an overlapping relationship with the ejector, each part of said pawl having a configuration defined relative a circuit board supporting structure such that pivoting of the pawl will cause part of said pawl to engage the supporting structure, thereby locking the circuit board to the supporting structure, said leaves and said ejector being defined and constructed relative to each other whereby said leaves are provided with a locking recess and said pawl is provided with a locking element, said recess and locking element being defined and having a configuration relative to each other to enable them to be releasably interengaged in a locked position.

6. A circuit board ejecting device comprising an ejector adapted to be pivotally mounted adjacent a corner of a circuit board for ejecting the circuit board from engagement with an electrical connector when pivoted against a circuit board support and mounting structure, said mounting structure having an ejector locking cut-out defined thereon, said ejector including a pair of spaced leaves to be arranged on opposite sides of the circuit board when mounted thereto, and a pawl comprising similar parts adapted to be disposed on opposite sides of a circuit board and to be pivotally mounted to the circuit board adjacent to and in an overlapping relationship with the ejector, each part of said pawl containing a protrusion having a configuration relative to the locking cut-out defined in the circuit board support mounting structure such that pivoting of the pawl will cause said protrusion to engage said recess, said pawl and said ejector being defined and constructed relative each other whereby said leaves are defined to engage and hold the pawl when the ejector is in a locked position and to release the pawl when the ejector is operated to eject the circuit board, said pawl including a raised portion and said leaves having a configuration defined relative said raised portion such that upon operation of the ejector said leaves engage and pivot the pawl, causing said protruding portion of the pawl to become disengaged from the recess in the support structure.

References Cited

UNITED STATES PATENTS

| | | | |
|---|---|---|---|
| 2,487,801 | 11/1949 | Healy | 339—91 |
| 2,993,187 | 7/1961 | Bisbing et al. | 339—17 |
| 3,335,386 | 8/1967 | Upton | 339—45 X |

RICHARD E. MOORE, *Primary Examiner.*

PATRICK A. CLIFFORD, *Assistant Examiner.*

U.S. Cl. X.R.

211—41; 339—45, 75